United States Patent
Yelehanka et al.

(10) Patent No.: US 8,536,705 B2
(45) Date of Patent: Sep. 17, 2013

(54) INTEGRATED CIRCUIT SYSTEM WITH THROUGH SILICON VIA AND METHOD OF MANUFACTURE THEREOF

(75) Inventors: Pradeep Ramachandramurthy Yelehanka, Singapore (SG); Denise Tan, Singapore (SG); Chung Meng Lek, Singapore (SG); Thomas Thiam, Singapore (SG); Jeffrey C. Lam, Singapore (SG); Liang-Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/455,152

(22) Filed: Apr. 25, 2012

(65) Prior Publication Data

US 2012/0205806 A1 Aug. 16, 2012

Related U.S. Application Data

(63) Continuation of application No. 13/158,660, filed on Jun. 13, 2011, now Pat. No. 8,236,688, which is a continuation of application No. 12/470,028, filed on May 21, 2009, now Pat. No. 7,960,282.

(51) Int. Cl.
*H01L 23/48* (2006.01)

(52) U.S. Cl.
USPC .......................................................... 257/751

(58) Field of Classification Search
USPC .......................................................... 438/667
See application file for complete search history.

(56) References Cited

U.S. PATENT DOCUMENTS

| | | | |
|---|---|---|---|
| 4,868,631 A * | 9/1989 | Hollingsworth et al. ...... | 257/517 |
| 6,198,116 B1 * | 3/2001 | Cerny et al. .................... | 257/194 |
| 7,111,149 B2 * | 9/2006 | Eilert ............................. | 711/220 |
| 7,960,282 B2 | 6/2011 | Yelehanka et al. | |
| 2006/0105449 A1 * | 5/2006 | Larmer et al. ............. | 435/287.2 |
| 2007/0099414 A1 | 5/2007 | Frohberg et al. | |
| 2008/0054313 A1 * | 3/2008 | Dyer et al. .................... | 257/276 |
| 2008/0315418 A1 | 12/2008 | Boyd et al. | |
| 2009/0001598 A1 | 1/2009 | Chiou et al. | |
| 2009/0051046 A1 | 2/2009 | Yamazaki et al. | |
| 2009/0111263 A1 | 4/2009 | Chen et al. | |
| 2010/0032811 A1 | 2/2010 | Ding et al. | |
| 2010/0237472 A1 * | 9/2010 | Gillis et al. ................... | 257/621 |

* cited by examiner

*Primary Examiner* — Thao P. Le
(74) *Attorney, Agent, or Firm* — Horizon IP Pte. Ltd.

(57) ABSTRACT

A method of manufacture of an integrated circuit system includes: providing a substrate including an active device; forming a through-silicon-via into the substrate; forming an insulation layer over the through-silicon-via to protect the through-silicon-via; forming a contact to the active device after forming the insulation layer; and removing the insulation layer.

8 Claims, 7 Drawing Sheets

INTEGRATED CIRCUIT SYSTEM WITH THROUGH SILICON VIA AND METHOD OF MANUFACTURE THEREOF

CROSS-REFERENCE TO RELATED APPLICATIONS

This application is a continuation application of co-pending U.S. patent application Ser. No. 13/158,660, filed Jun. 13, 2011 which is a continuation application of U.S. patent application Ser. No. 12/470,028, filed May 21, 2009, now U.S. Pat. No. 7,960,282, which are hereby incorporated by reference in their entireties.

TECHNICAL FIELD

The present invention relates generally to an integrated circuit system, and more particularly to an integrated circuit system with a through-silicon-via.

BACKGROUND ART

Integrated circuits find application in many of today's consumer electronics, such as cell phones, video cameras, portable music players, printers, computers, calculators, automobiles, etc. Miniaturization of these consumer electronics while providing increased functional integration of memory and logic has long been one of the major drivers within the semiconductor industry. Consequently, manufacturer's are turning to three-dimensional packaging to achieve the required high level of functional integration necessary to support these products.

Through silicon vias (TSV's) provide one technique used within the industry for enabling three-dimensional stacking of integrated circuits (ICs), thereby providing the possibility of heterogeneous integration. Additionally, TSV technology offers a reduction in area consumed by the interconnections, while providing shortened electrical pathways with reduced RC delay.

Unfortunately, many current methodologies do not adequately separate the TSV formation process from the contact formation process. Accordingly, corrosion and contamination of these electrical contacts may occur.

Thus, a need still remains for a reliable integrated circuit system and method of fabrication, wherein the integrated circuit system prevents cross contamination and corrosion of TSV and contact structures. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: providing a substrate including an active device; forming a through-silicon-via into the substrate; forming an insulation layer over the through-silicon-via to protect the through-silicon-via; forming a contact to the active device after forming the insulation layer; and removing the insulation layer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
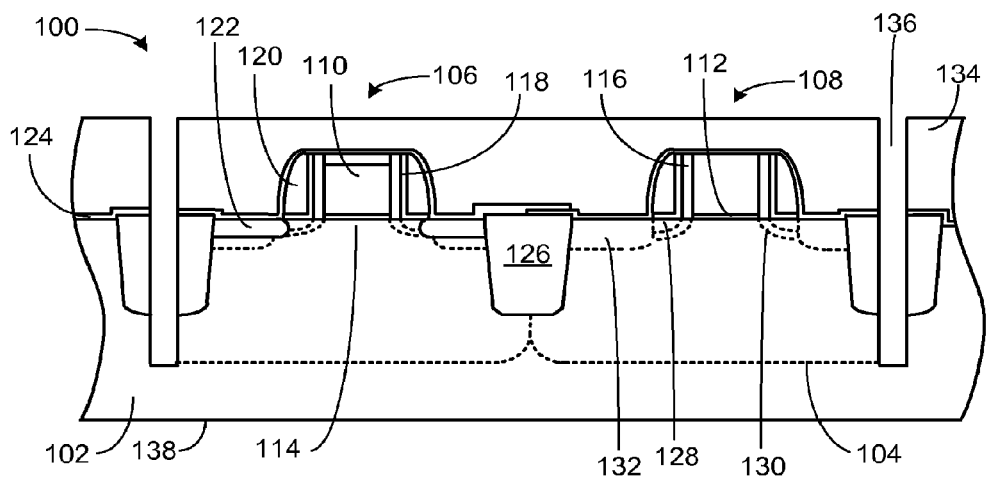
FIG. 1 is a partial cross sectional view of an integrated circuit system in an initial stage of manufacture in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the conventional plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "processing" as used herein includes deposition of material or photoresist, patterning, exposure, development, etching, cleaning, and/or removal of the material or photoresist as required in forming a described structure.

The term "on" is defined to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first" and "second" as used herein are for purposes of differentiation between elements only and are not to be construed as limiting the scope of the present invention.

The term "layer" encompasses both the singular and the plural unless otherwise indicated.

The term "self aligned" is used herein to mean the act of performing one or more steps involving one or more materials such that the features formed are automatically aligned with respect to one another in that processing step.

The term "active device" is used herein to mean a fully functioning and operable device that can increase the magnitude of a given electrical input parameter by merely establishing electrical contacts.

FIGS. 1-19, which follow, depict by way of example and not by limitation, an exemplary process for the formation of an integrated circuit system and they are not to be construed as limiting. It is to be understood that a plurality of conventional processes that are well known within the art and not repeated herein, may precede or follow FIGS. 1-19. Moreover, it is to be understood that many modifications, additions, and/or omissions may be made to the below described process without departing from the scope of the claimed subject matter. For example, the below described process may include more, fewer, or other steps. Additionally, steps may be performed in any suitable order without departing from the scope of the present invention.

Moreover, it is to be appreciated that the active device of the present disclosure may include any number of multi-electrode devices (e.g., active device structures) in which the current flowing between two specified electrodes is controlled or modulated by the voltage applied at a control electrode. Exemplary illustrations may include a bipolar junction transistor (BJT), an n-channel metal-oxide semiconductor (NMOS), a p-channel metal-oxide semiconductor (PMOS), a complementary metal-oxide semiconductor (CMOS) configuration, a single-gate transistor, a multi-gate transistor, a fin-field effect transistor (fin-FET), or an annular gate transistor. Furthermore, it is to be understood that one or more of the integrated circuit system could be prepared at one time on a medium, which could be separated into individual or multiple integrated circuit assemblies at a later stage of fabrication.

Moreover, it will be appreciated by those skilled in the art that the techniques of the present embodiments can be used to fabricate an integrated circuit system, for example, an active device, using existing conventional NMOS, PMOS, and CMOS compatible process technology, thereby minimizing or reducing the cost of manufacturing.

Moreover, it is to be understood that the one or more of the active device of the integrated circuit system manufactured by the embodiments described herein can be used within processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

It should be understood that the definitions and nomenclature used herein are given by way of example only and that one skilled in the art would readily understand that other definitions and nomenclature may be used to illustrate the techniques, systems, devices, and methods described herein.

Moreover, the thickness of the layers described herein will depend upon the design rules and the current process technology node. However, it will be understood by those skilled in the art that the present embodiments are not limited to any specific process technology node, nor to any specific value in any of the process parameters described herein.

Generally, the following embodiments relate to a method or system for integrating a through-silicon-via and a contact into the normal wafer fabrication process at the front end. In at least one embodiment, an oxide mask can be used to define the contacts, while protecting the already formed through-silicon-via. In another embodiment, a nitride mask can be used to define the contacts, while protecting the already formed through-silicon-via. In yet another embodiment, a nitride mask can be used to define the through-silicon-via, while protecting the already formed contacts.

Referring now to FIG. 1, therein is shown a partial cross sectional view of an integrated circuit system 100 in an initial stage of manufacture in accordance with an embodiment of the present invention. In general, the integrated circuit system 100 may include one or more of an active device and/or a passive device. In such cases, a multitude of different regions (e.g., memory, logic, high voltage, etc.) can be formed over, on and/or within a substrate 102 for the manufacture of active and/or passive device structures by conventional deposition, patterning, photolithography, and etching techniques known in the semiconductor processing industry. Moreover, it will be appreciated by those skilled in the art that although the present embodiments are generally depicted with respect to two active device structures, it is to be understood that the system and methods described herein are applicable to one or more active device structures (e.g., NMOS or PMOS) formed within isolated, semi-dense or dense array configurations.

In some embodiments, the substrate 102 may include a two hundred (200) mm or three hundred (300) mm semiconductor wafer, upon which any number of active and/or passive device structures and their interconnections could be formed. By way of example, the substrate 102 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 102 may also include doped and undoped configurations, epitaxial layers, strained configurations, and one or more crystal orientations (e.g.—<100>, <110>, and/or <111> orientations), which may be strategically employed to optimize carrier mobility within NMOS and PMOS devices. The substrate 102 may also include any material that becomes amorphous upon implantation.

In one embodiment, the substrate 102 may also include one or more of a well 104, such as an n-type well where p-type MOSFETs may be formed, a p-type well where n-type MOSFETs may be formed, and/or a twin well configuration (e.g., an n-type well adjacent a p-type well). In at least one embodiment, the well 104 may include a lightly doped well. It will be appreciated by those skilled in the art that a retrograde well implant may be used to obtain optimum electrical characteristics for the devices formed within the substrate 102.

In some embodiments, the substrate 102 may possess a thickness ranging from about one hundred (100) nanometers to about several hundred microns, for example.

However, the examples provided for the substrate 102 are not to be construed as limiting and the composition of the substrate 102 may include any surface, material, configuration, or thickness that physically and electrically enables the formation of active and/or passive device structures.

An active device, such as a first device 106 and a second device 108, can be formed over, on and/or within the substrate 102 by conventional deposition, patterning, photolithography, and etching techniques known in the semiconductor processing industry for the manufacture of active and/or passive devices. In some embodiments, the first device 106 and the second device 108 may include one or more of an active device, such as one or more of an NMOS device or one or more of a PMOS device. In other embodiments, the first device 106 and the second device 108 may include a PMOS device and an NMOS device cooperatively coupled, thereby forming a CMOS device. However, it is to be understood that the first device 106 and the second device 108 are not limited to the preceding examples and may include any number of multi-electrode devices in which the current flowing between two specified electrodes is controlled or modulated by the voltage applied at a control electrode.

In general, the first device 106 and the second device 108 may both include a gate 110, a gate dielectric 112, a channel 114, a first spacer 116, a first liner 118, a second spacer 120, a silicide contact 122, a dielectric layer 124, an isolation structure 126, a source/drain extension 128, a halo 130, a source/drain 132, a passivation layer 134, and a TSV opening 136.

In some embodiments, the gate 110 may be formed from conventional materials including doped and undoped semiconducting materials (such as, for example, polySi, amorphous Si, or SiGe), a metal, a metallic alloy, a silicide, a metal nitride, a metal oxide, a carbon nanotube, or a combination thereof. By way of example, if the gate 110 includes a metal, the metal may include copper, tungsten, aluminum, aluminum alloy, palladium, titanium, tantalum, nickel, cobalt, and molybdenum. Furthermore, by way of example, if the gate 110 includes a metal silicide, the metal silicide may include copper silicide, tungsten silicide, aluminum silicide, palladium silicide, titanium silicide, tantalum silicide, nickel silicide, cobalt silicide, erbium silicide, and molybdenum silicide. In accordance with the scope of the present embodiments, other materials, which may be known to those skilled in the art for gate structures, may also be used for the gate 110.

Generally, the gate 110 can be formed by chemical vapor deposition (CVD), physical vapor deposition (PVD), silicidation, plating, and/or atomic layer deposition (ALD). The gate 110 may also include a multilayer structure and/or a dual structure including different gate heights for different gate structures.

The gate dielectric 112 may be made from materials including, but not limited to, silicon oxide, silicon oxynitride, silicon nitride, a silicon oxide/nitride/oxide stack, a high-k dielectric material (i.e., one having a dielectric constant value greater than silicon oxide), or a combination thereof. However, it is to be understood that the type of material chosen for the gate dielectric 112 is not limited to the preceding examples; for example, the gate dielectric 112 may include any material that permits induction of a charge in the channel 114 when an appropriate voltage is applied to the gate 110. In accordance with the scope of the present embodiments, other materials, which may be known to those skilled in the art for gate structures, may also be used for the gate dielectric 112.

The gate dielectric 112 can be formed by thermal oxidation, ALD, CVD, or PVD. The gate dielectric 112 may also include a multilayer structure and/or different materials for NMOS and PMOS devices. In at least one embodiment, the gate dielectric 112 may include a multi-layer structure, such as a first layer of an oxide and a second layer of a high-k material.

It will be appreciated by those skilled in the art that the thickness of the gate 110 and the gate dielectric 112 can vary with the design specifications and/or the current technology process node (e.g., 45 nm, 32 nm, etc.) for the integrated circuit system 100. Generally, the thickness of the gate 110 is between about 500 angstroms and about 3000 angstroms and the thickness of the gate dielectric 112 is between about 10 angstroms and about 50 angstroms. However, larger or smaller thicknesses of the gate 110 and the gate dielectric 112 may be appropriate depending on the design specifications of the first device 106 and the second device 108.

The first spacer 116 can be formed adjacent the gate 110 and may include dielectric materials such as an oxide, a nitride, or a combination thereof, but preferably includes silicon dioxide. The first spacer 116 can be formed by a variety of techniques, including, but not limited to, physical vapor deposition, chemical vapor deposition and thermal oxidation, followed by an appropriate etch process that forms a substantially vertical sidewall, in at least one embodiment.

The first liner 118 can be formed adjacent the first spacer 116 and may include dielectric materials such as an oxide, a nitride, or a combination thereof, but preferably includes silicon dioxide. The first spacer 116 can be formed by a variety of techniques, including, but not limited to, physical vapor deposition, chemical vapor deposition and thermal oxidation, followed by an appropriate etch process, thereby forming a substantially "L" shaped liner, in at least one embodiment.

The second spacer 120 can be formed adjacent the first liner 118 and typically includes a material (e.g., an oxide, a nitride, or a combination thereof) that can be selectively etched with respect to the material of the first liner 118. For example, if the first liner 118 is formed using silicon dioxide, the second spacer 120 can be formed using silicon nitride. For such a spacer material composition, a plurality of anisotropic etch recipes with moderately high etch selectivity are well know within the art. The second spacer 120 can be formed by a variety of techniques, including, but not limited to, chemical vapor deposition and physical vapor deposition, followed by an appropriate anisotropic etch.

In other embodiments, the first spacer 116, the first liner 118, and/or the second spacer 120 may also include any type of stress-inducing material that transfers its inherent or intrinsic stress to the gate 110, the channel 114, a source/drain extension region, and/or a source/drain region. In such cases, the stress-inducing material may include a stress memorization material or a compressive and/or tensile stressed material. By way of example, when the first spacer 116, the first liner 118, and/or the second spacer 120 include the characteristics of a stress memorization layer, the first spacer 116, the first liner 118, and/or the second spacer 120 can transfer their intrinsic stress to an active device upon recrystallization of the amorphous regions within the active device or the substrate 102. Generally, such techniques permit the first spacer 116, the first liner 118, and/or the second spacer 120 to impart a compressive stress or a tensile stress upon the channel 114, thereby enhancing the amount of current that can flow through the device.

However, it is to be understood that the type of materials chosen for the first spacer 116, the first liner 118, and the second spacer 120 are not limited to the above examples and may include any material that permits electrical isolation of the gate 110, formation of a lateral dopant profile within the substrate 102 adjacent the channel 114, and/or a moderately high etch selectivity between the first liner 118 and the second spacer 120.

It is to be understood that the thickness and/or width of each of the first spacer 116, the first liner 118, and the second spacer 120 may determine, at least in part, the location of a subsequently formed source and drain region, a low resistance electrical contact, and/or the proximity of a subsequently deposited stressor layer to the channel 114. Accordingly, the thickness and/or width of each of the first spacer 116, the first liner 118, and the second spacer 120 can be altered to meet the design specification (e.g., sub 45 nanometer technology node critical dimensions) of the integrated circuit system 100. For example, the thickness of the first spacer 116, the first liner 118, and/or the second spacer 120 may vary with the desired placement of a low resistance electrical contact over a source/drain region and its resultant proximity effects upon the channel 114 of an active device.

Furthermore, it will be appreciated by those skilled in the art that although the spacer structure is depicted as a combination of the first spacer 116, the first liner 118, and the second spacer 120, it is to be understood that the spacer structure can be formed by one or more spacers.

The integrated circuit system 100 may also include the silicide contact 122, such as a low resistance silicide or salicide electrical contact, formed over the gate 110 and the source/drain 132. In some embodiments, the silicide contact 122 may include any conducting compound that forms an electrical interface between itself and another material that is thermally stable and provides uniform electrical properties with low resistance. In other embodiments, the silicide contact 122 may include refractory metal materials such as, tantalum (Ta), cobalt (Co), titanium (Ti), tungsten (W), platinum (Pt), or molybdenum (Mo). In yet other embodiments, the silicide contact 122 formed over the source/drain 132 can be self-aligned to the second spacer 120 via a salicide process.

It will be appreciated by those skilled in the art that the silicide contact 122 can affect the mobility of carriers (e.g., due to stresses imparted by the silicide contact 122) within the channel 114 of either the first device 106 or the second device 108. For example, in cases where the first device 106 and/or the second device 108 includes a PMOS device, if the silicide contact 122 is placed too close to the channel 114 of either device, the silicide contact 122 can detrimentally affect the mobility of carriers within the channel 114. As such, it is to be understood that the thickness of the first spacer 116, the first liner 118, and the second spacer 120 can be modulated (e.g., by increasing the thickness) to reduce or negate the detrimental effect that the silicide contact 122 can have on carrier mobility within the channel 114 of the first device 106 and/or the second device 108.

Alternatively, the thickness of the first spacer 116, the first liner 118, and the second spacer 120 can also be modulated (e.g., by decreasing the thickness) to enhance the effect that the silicide contact 122 can have on carrier mobility within the channel 114 of an active device (e.g., an NMOS device). Accordingly, the thickness of the first spacer 116, the first liner 118, and the second spacer 120 can be modulated to enhance or reduce the effects that the silicide contact 122 can have on the stress level within the first device 106 and/or the second device 108.

Although the silicide contact 122 is shown formed over the first device 106, it will be appreciated by those skilled in the art that the silicide contact 122 can be formed over or on each of the first device 106 and/or the second device 108, as well as, any or all of the active device formed within the integrated circuit system 100.

The dielectric layer 124 can be non-selectively or selectively deposited over or on the entirety or portions of the integrated circuit system 100. In at least one embodiment, the dielectric layer 124 may include a barrier layer (e.g., silicon nitride) that protects the active regions within the substrate 102 from dopants in a subsequently deposited film or layer.

In another embodiment, the dielectric layer 124 may include a stress engineered material that induces a stress upon the first device 106 and the second device 108. In such cases, the stress engineered layers can be strategically designed and deposited to exert compressive and/or tensile stresses, depending upon the type of device (e.g., tensile for NMOS and compressive for PMOS).

By way of example, the dielectric layer 124 may include a silicon nitride layer deposited by a plasma enhanced chemical vapor deposition process. In such cases, it is to be understood that a multitude of deposition parameters, such as reactant flow rates, pressure, temperature, RF power and frequency, reactant materials, and thickness, can be adjusted to modulate the compressive or tensile stress within the dielectric layer 124. Moreover, it will be appreciated by those skilled in the art that the above parameters are not limiting and that additional parameters may also be employed and/or manipulated to effectuate the purpose of forming the dielectric layer 124 with a specified internal stress that will increase the performance of an active device by enhancing the carrier mobility within the channel 114. In other embodiments, the dielectric layer 124 may also include a stress memorization layer that transfers its stress to the first device 106 and the second device 108 upon annealing.

The isolation structure 126, which may include a shallow trench isolation structure, a local oxidation of silicon structure, and/or other suitable isolation features, can electrically isolate and/or separate the first device 106, the second device 108, and other devices from each other. In some embodiments, the isolation structure 126 can be made from a dielectric material such as silicon oxide, silicon nitride, or silicon oxynitride. In other embodiments, the isolation structure 126 may also include a multi-layer structure of one or more dielectric materials.

At this stage of manufacture, the integrated circuit system 100 may also include the source/drain extension 128, the halo 130, and/or the source/drain 132. It will be appreciated by those skilled in the art that the formation of the source/drain extension 128, the halo 130, and/or the source/drain 132 can be coordinated with the formation of the first spacer 116, the first liner 118, and/or the second spacer 120, thereby permitting a self-aligned process.

As is well known in the art, the source/drain extension 128 can be formed adjacent the channel 114. In general, the source/drain extension 128 may be formed to a shallow depth with a low concentration of impurities relative to a source and drain region to facilitate dimensional reductions for the scaling of the integrated circuit system 100. More specifically, the source/drain extension 128 can be formed from a dopant implant dose between about $1 \times 10^{14}$ ions/cm$^2$ to about $5 \times 10^{15}$ ions/cm$^2$. However, larger or smaller doses may be used depending upon the impurity used and the design specifications of the first device 106 and the second device 108. Moreover, it is to be understood that the above parameter is not limiting and those skilled in the art will appreciate that additional parameters may also be employed/manipulated to effectuate the purpose of implanting a highly-doped and abrupt form of the source/drain extension 128.

The impurities used to form the source/drain extension 128 may include n-type or p-type, depending on the first device 106 and/or the second device 108 being formed (e.g., n-type impurities for an NMOS device and p-type impurities for a PMOS device).

The halo 130 can be formed adjacent the source/drain extension 128. As is known in the art, a halo implant can help to decrease the length of the channel 114, which may be advantageous for minimizing punchthrough current and controlling short channel effects, thereby improving the performance of an active device. In general, the halo 130 can be formed by implanting the substrate 102 with impurities of opposite conductivity type to that of the impurities used to form the source/drain 132 and the source/drain extension 128. For example, if the source/drain 132 and the source/drain extension 128 are formed with n-type impurities then the halo 130 can be formed with p-type impurities.

The halo dopant material is typically implanted at an angle so that the dopant material can be implanted underneath the first spacer 116, the first liner 118, the second spacer 120, and/or the gate 110. In general, the angle of the implantation is typically substantially less than ninety degrees relative to the surface of the substrate 102, e.g., between about fifteen to about seventy-five degrees relative to the surface of the substrate 102. In some embodiments, the substrate 102 can be rotated (e.g., dual and quad halo implants) during the angled halo implantation to provide symmetrical forms of the halo 130. However, in other embodiments, the halo dopant implant may be implanted perpendicular to the surface of the substrate 102.

It is to be understood that the order in which the source/drain extension 128 and the halo 130 are formed is not critical, what is important is that the process parameters (e.g., dose and energy) used to form the source/drain extension 128 and the halo 130 be regulated to produce the desired conductivity type and electrical characteristics within each of the source/drain extension 128 and the halo 130. For example, the source/drain extension 128 and the halo 130 may each be formed at a sufficient dose such that the majority concentration of impurities in each is of opposite conductivity type.

In some embodiments, the source/drain 132 can be self-aligned to the second spacer 120. In general, the source/drain 132 may be of the same conductivity type as the dopants used to form the source/drain extension 128 (e.g., n-type impurities for an NMOS device or p-type impurities for a PMOS device).

Generally, the source/drain 132 can be implanted with a medium to high dose and an energy that is sufficient to amorphize the substrate 102, thereby permitting a stress memorization transfer, if desired. However, larger or smaller doses and energies may be employed depending upon the impurity used and the design specifications of the integrated circuit system 100. Moreover, it is to be understood that the above parameters are not limiting and those skilled in the art will appreciate that additional parameters may also be employed/manipulated to effectuate the purpose of implanting a highly-doped and abrupt form of the source/drain 132.

Subsequent to forming the first device 106 and the second device 108, the passivation layer 134 can be non-selectively or selectively deposited over or on the entirety or portions of the integrated circuit system 100. Generally, the passivation layer 134 may include an oxide, a nitride, or a combination thereof. It will be appreciated by those skilled in the art that the passivation layer 134 can help to protect the underlying devices from subsequent processing steps, while providing an insulative effect from subsequently deposited conductive materials.

The TSV opening 136 can be formed from the top side through the passivation layer 134, the dielectric layer 124, the isolation structure 126, and into the substrate 102 in one or more regions of the integrated circuit system 100. In other embodiments, the TSV opening 136 can be formed all the way through the substrate 102. In yet other embodiments, the TSV opening 136 can be formed from a bottom side 138 of the substrate 102. It is to be understood that the TSV opening 136 may include a through-silicon-via (TSV) that can be used for electrical interconnections. Generally, the TSV opening 136 can be formed by machining and/or etching. In such cases, mechanical drilling, laser ablation, and certain wet and dry etches can be used, for example.

It will be appreciated by those skilled in the art that the depth and diameter of the TSV opening 136 can vary with the via type, the application, the design specifications and/or the current technology process node (e.g., 45 nm, 32 nm, etc.) for the integrated circuit system 100. By way of example, the depth of the TSV opening 136 can vary from about 20 microns to about 500 microns and the diameter can vary from about 200 nm to about 200 microns. Generally, the aspect ratio for the TSV opening 136 can vary from about 0.3:1 to greater than about 20:1.

Subsequent to forming the TSV opening 136, it is to be understood that the integrated circuit system 100 may undergo a cleaning step to remove surface contaminants, such as particles, mobile ionic contaminants, organics and native oxides. In at least one embodiment, the cleaning step may include a Standard Clean 1 (SC-1) process.

Figure 2:
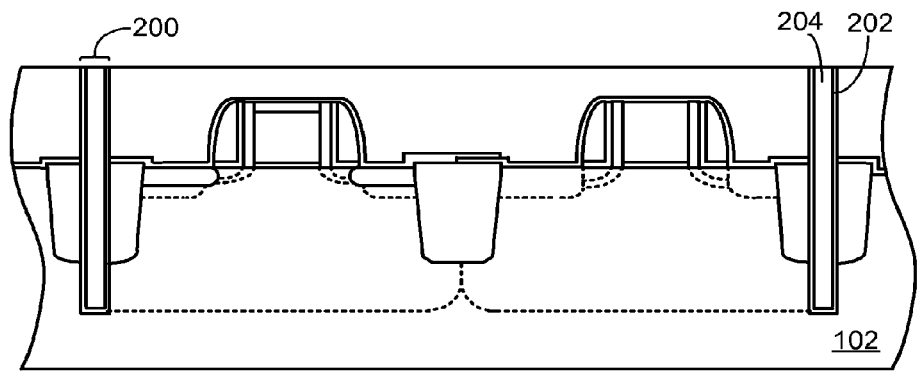
FIG. 2 is the structure of FIG. 1 after forming a TSV.

Referring now to FIG. 2, therein is shown the structure of FIG. 1 after forming a TSV 200. The TSV 200 may include a TSV barrier 202 and a TSV conductor 204.

Generally, the TSV barrier 202 may include a dielectric material that helps to electrically insulate or isolate the TSV conductor 204 from the substrate 102. In at least one embodiment, the TSV barrier 202 may include an oxide layer formed by thermal oxidation, although it is understood that other materials and processes can be used. It will be appreciated by those skilled in the art that the TSV barrier 202 can be strategically designed to also help reduce electromigration of mobile ionic contaminants. It is to be understood that the TSV barrier 202 can be formed within the TSV opening 136, of FIG. 1.

The TSV conductor 204 can be deposited over or on the TSV barrier 202 and may include any conductive material. In at least one embodiment, the TSV conductor 204 may include a tungsten or copper material. It will be appreciated by those skilled in the art that a seed layer can be deposited before filling with the TSV conductor 204 to improve the deposition and interface quality.

Generally, the TSV conductor 204 can be deposited by any process that adequately fills each of the TSV opening 136, thereby forming a solid and robust electrical interconnection (e.g., one without substantial voids). It is to be understood that each of the TSV opening 136 can be overfilled to ensure adequate filling of the TSV opening 136. By way of example, the TSV conductor 204 can be deposited by a CVD, a PVD or an ALD type process.

Figure 3:
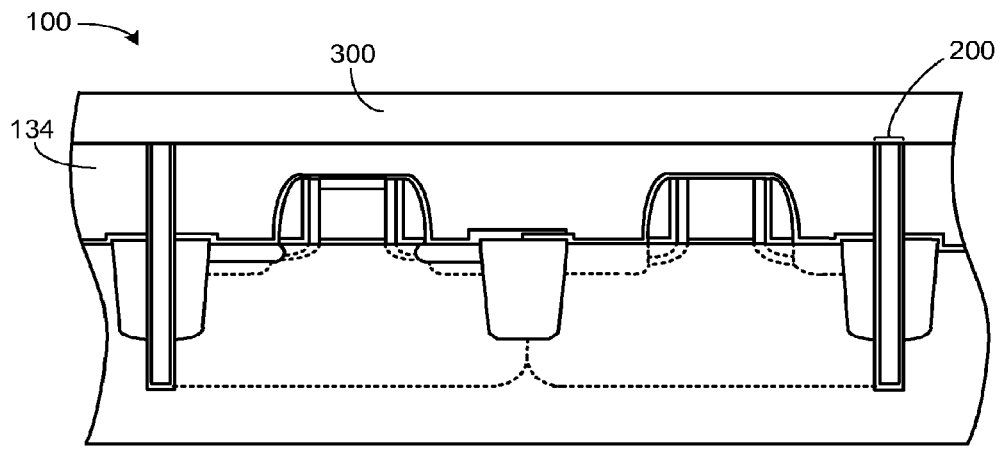
FIG. 3 is the structure of FIG. 2 after forming an insulation layer.

Referring now to FIG. 3, therein is shown the structure of FIG. 2 after forming an insulation layer 300. In at least one embodiment, the insulation layer 300 can be formed over or on the passivation layer 134 and may include an oxide (e.g., an oxide mask), although it is understood that other dielectric materials may be used as well. Generally, the purpose or function of the insulation layer 300 can be to cover and/or protect the TSV 200 from corrosion or contamination that may occur during subsequent electrical contact formations. Typically, the thickness of the insulation layer 300 can vary with the design specifications and/or the current technology process node (e.g., 45 nm, 32 nm, etc.) for the integrated circuit system 100; however, these parameters are not limiting. As such, in accordance with the present embodiments, the thickness of the insulation layer 300 is only to be limited to an amount that protects the TSV 200 from subsequent process steps.

Figure 4:
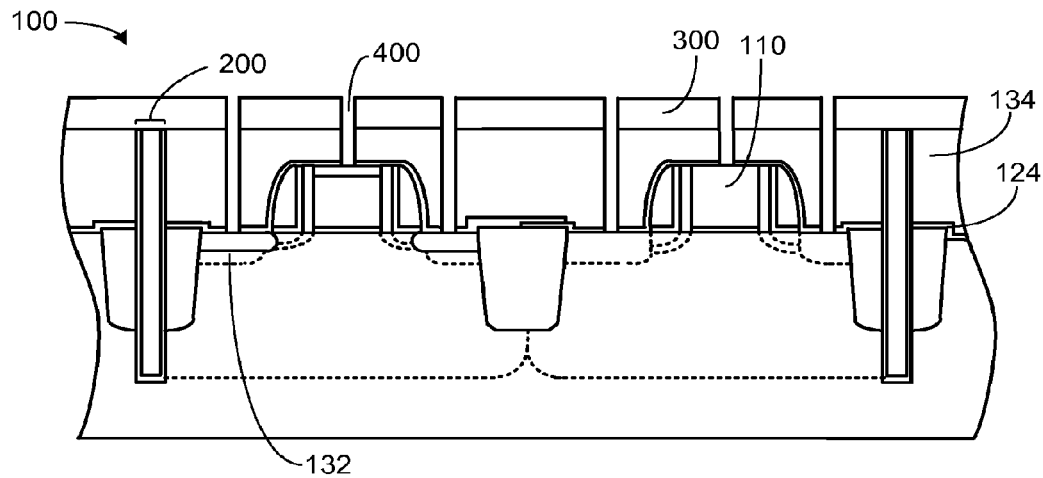
FIG. 4 is the structure of FIG. 3 after forming a contact opening.

Referring now to FIG. 4, therein is shown the structure of FIG. 3 after forming a contact opening 400. Generally, each of the contact opening 400 can be formed from the top side through the insulation layer 300, the passivation layer 134, and the dielectric layer 124 to contact the gate 110 and the source/drain 132 of each active device. Notably, the insulation layer 300 and the location of each of the contact opening 400 prevents corrosion or contamination of the TSV 200. In at least one embodiment, each of the contact opening 400 is formed so as to not touch the TSV 200. The etchants and techniques used to form the contact opening 400 are well known within the art and not repeated herein.

Subsequent to forming the contact opening 400, it is to be understood that the integrated circuit system 100 may undergo a cleaning step to remove surface contaminants, such as particles, mobile ionic contaminants, organics and native oxides. In at least one embodiment, the cleaning step may include an SC-1 process.

Figure 5:
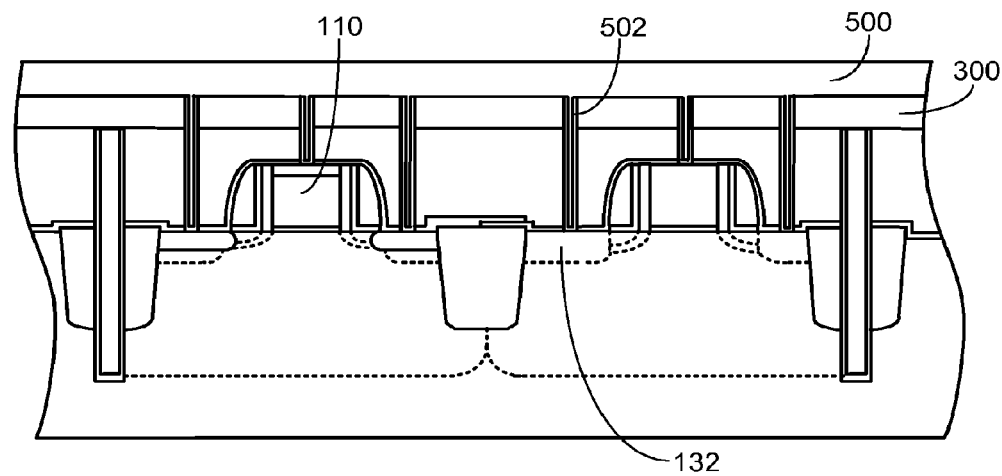
FIG. 5 is the structure of FIG. 4 after forming a conductive layer.

Referring now to FIG. 5, therein is shown the structure of FIG. 4 after forming a conductive layer 500. Generally, the conductive layer 500 can be formed over or on the integrated circuit system 100 and may include any material that offers a low resistance to the passage of electrical current. In at least one embodiment, the conductive layer 500 may include a tungsten type material. In such cases, prior to forming the conductive layer 500, a barrier layer 502, such as titanium/titanium nitride layer, can be deposited to improve adhesion and to reduce electromigration of the tungsten material, although it is understood that other barrier layers can be used, as well.

In at least one embodiment, it will be appreciated by those skilled in the art that an in-situ hydrogen-based plasma treatment can be utilized during the tungsten nucleation step, thereby helping to reduce and/or eliminate detrimental fluorine concentration at the tungsten/titanium nitride interface. Moreover, it will be appreciated by those skilled in the art that reduced fluorine concentration levels can help to increase the titanium/titanium nitride and tungsten process windows, thereby allowing thinner barrier or tungsten nucleation layers to be introduced for further contact resistance reduction without yield compromise.

Generally, the conductive layer 500 can be deposited by any process that adequately fills each of the contact opening 400, of FIG. 4, thereby forming a solid and robust electrical interconnection (e.g., one without substantial voids) with each of the gate 110 and the source/drain 132. It is to be understood that each of the contact opening 400 can be overfilled to ensure adequate filling of the contact opening 400. In such cases, the conductive layer 500 can be formed over or on the insulation layer 300 with an adequate thickness. By way of example, the conductive layer 500 can be deposited by a CVD, a PVD or an ALD type process.

Figure 6:
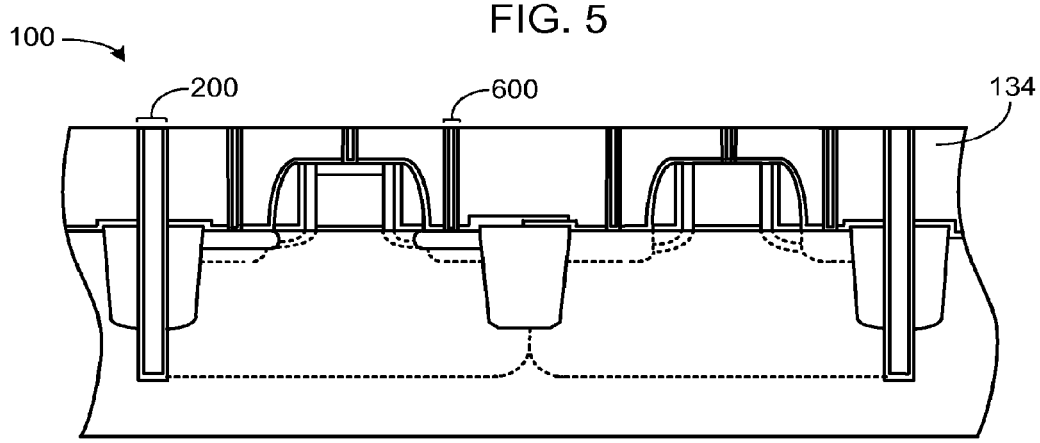
FIG. 6 is the structure of FIG. 5 after removal of excess material.

Referring now to FIG. 6, therein is shown the structure of FIG. 5 after removal of excess material. Generally, the integrated circuit system 100 may undergo a local or global planarization process that removes portions of the conductive layer 500 (of FIG. 5) and the insulation layer 300 (of FIG. 5). In at least one embodiment, the conductive layer 500 and the insulation layer 300 can be removed until the passivation layer 134 is reached by a chemical mechanical planarization process, thereby exposing the TSV 200 and a contact 600. It is to be understood that the contact 600 is formed from the conductive layer 500 filled within the contact opening 400, of FIG. 4.

It will be appreciated by those skilled in the art that the present embodiments merely employ the insulation layer 300 as a mask, thereby permitting its removal and reducing the overall profile or thickness of the integrated circuit system 100.

Moreover, it will be appreciated by those skilled in the art that by employing separate filling operations that different materials for the TSV 200 and the contact 600 can be utilized. Furthermore, by separating the TSV 200 and the contact 600 filling processes, material filling rates can be better controlled. It will be appreciated by those skilled in the art that material filling rates can be difficult to control because the TSV 200 and the contact 600 may possess different diameters, thereby affecting the fill rates. Additionally, separate filling processes for the TSV 200 and the contact 600 allows for a cleaner process that prevents cross contamination.

Notably, the TSV 200 and the contact 600 can be physically and electrically separated from each other by employing the method, system, and/or device described by the present embodiments herein.

Subsequent to planarization, it is to be understood that the integrated circuit system 100 may undergo a cleaning step to remove surface contaminants, such as particles, mobile ionic contaminants, organics and native oxides.

Thus, it has been discovered that the use of the insulation layer 300, such as an oxide mask, to define the contact opening 400 after forming the TSV 200, helps to protect the TSV 200 from contamination and corrosion. For example, by forming the insulation layer 300 over the TSV 200, the insulation layer 300 helps to protect the TSV 200 from corroding during formation of the contact opening 400. Moreover, by separating the etching processes used to form the TSV 200 and the contact 600 by forming the insulation layer 300, incidences of cross contamination can be reduced. Furthermore, separating the etch processes by forming the insulation layer 300 permits the TSV 200 to be formed of a different material from the contact 600, thereby permitting separate optimization for each structure.

Referring now to FIGS. 7-18. FIGS. 7-18 include some of the same reference numbers used to describe the integrated circuit system 100 in FIGS. 1-6 and the process steps of FIGS.

1-6. It is noted that the layers, structures, and process steps corresponding to such reference numbers generally include the same characteristics (e.g., composition, thickness, function, process techniques, etc.) as those described in reference to FIGS. 1-6 and, therefore, their descriptions are not reiterated in detail for FIGS. 7-18. Rather the descriptions of the layers, structures, and process steps corresponding to reference numbers in FIGS. 1-6 are incorporated for the same reference numbers included in FIGS. 7-18.

Figure 7:
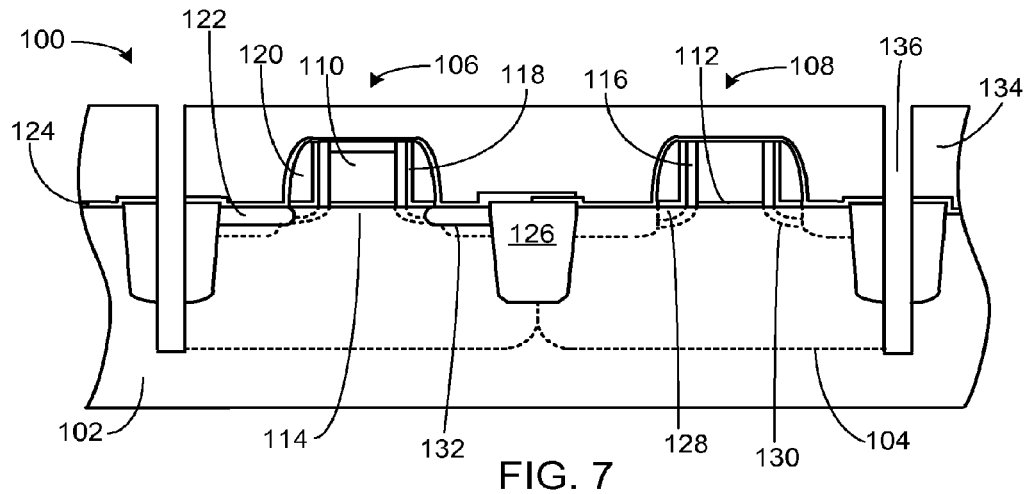
FIG. 7 is a partial cross sectional view of an integrated circuit system in an initial stage of manufacture in accordance with an embodiment of the present invention.

Referring now to FIG. 7, therein is shown a partial cross sectional view of the integrated circuit system 100 in an initial stage of manufacture in accordance with another embodiment of the present invention. The integrated circuit system 100 may include the substrate 102, the well 104, the first device 106, the second device 108, the gate 110, the gate dielectric 112, the channel 114, the first spacer 116, the first liner 118, the second spacer 120, the silicide contact 122, the dielectric layer 124, the isolation structure 126, the source/drain extension 128, the halo 130, the source/drain 132, the passivation layer 134, and the TSV opening 136. It is to be understood that the substrate 102, the well 104, the first device 106, the second device 108, the gate 110, the gate dielectric 112, the channel 114, the first spacer 116, the first liner 118, the second spacer 120, the silicide contact 122, the dielectric layer 124, the isolation structure 126, the source/drain extension 128, the halo 130, the source/drain 132, the passivation layer 134, and the TSV opening 136 may include any of the characteristics, such as material composition, thickness, function and/or process techniques, described above in regard to FIG. 1.

Figure 8:
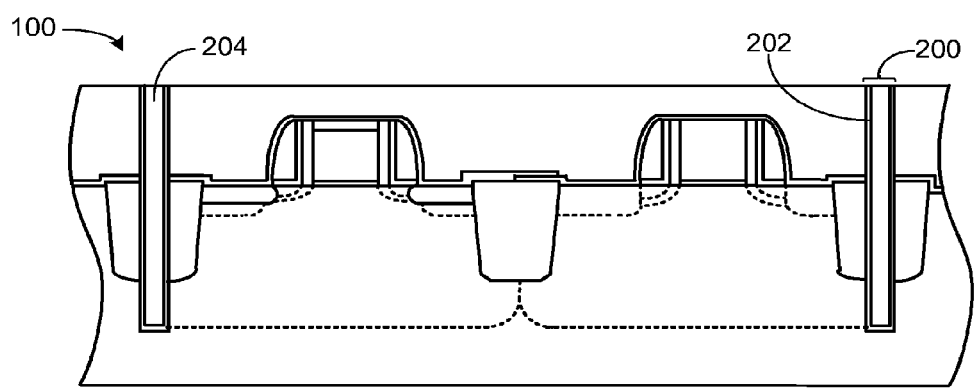
FIG. 8 is the structure of FIG. 7 after forming a TSV.

Referring now to FIG. 8, therein is shown the structure of FIG. 7 after forming the TSV 200. At this stage of manufacture, the integrated circuit system 100 of the present embodiment is similar to the integrated circuit system 100, of FIG. 2, and may include the TSV 200, the TSV barrier 202 and the TSV conductor 204. It is to be understood that the TSV 200, the TSV barrier 202 and the TSV conductor 204 may include any of the characteristics, such as material composition, thickness, function and/or process techniques, described above in regard to FIG. 2.

Subsequent to forming the TSV 200, the integrated circuit system 100 can be subject to an etching or planarization process to remove excess material of the TSV barrier 202 and the TSV conductor 204. Such a process was described above in reference to FIG. 6.

Figure 9:
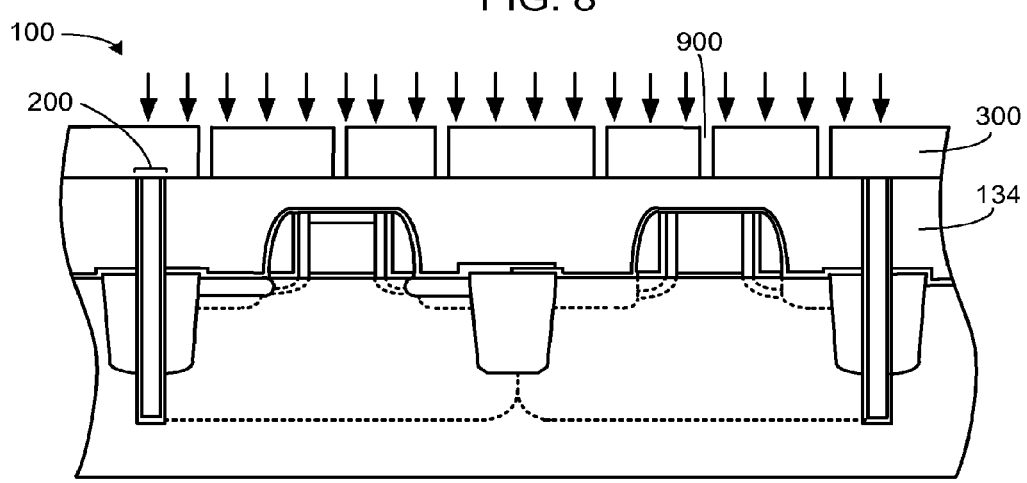
FIG. 9 is the structure of FIG. 8 after forming an insulation layer.

Referring now to FIG. 9, therein is shown the structure of FIG. 8 after forming the insulation layer 300. In at least one embodiment, the insulation layer 300 can be formed over or on the passivation layer 134 and may include a nitride (e.g., a nitride mask), although it is understood that other dielectric materials may be used as well. Generally, the purpose or function of the insulation layer 300 can be to cover and/or protect the TSV 200 from corrosion or contamination that may occur during subsequent electrical contact formations. Typically, the thickness of the insulation layer 300 can vary with the design specifications and/or the current technology process node (e.g., 45 nm, 32 nm, etc.) for the integrated circuit system 100; however, these parameters are not limiting. As such, in accordance with the present embodiments, the thickness of the insulation layer 300 is only to be limited to an amount that protects the TSV 200 from subsequent process steps.

In at least one embodiment, the insulation layer 300 can be used as a contact alignment layer. In such cases, an opening 900 can be formed in locations within the insulation layer 300 that define subsequent areas for forming contacts. It will be appreciated by those skilled in the art that the contact alignment process may utilize the positions of the TSV 200, in addition to the conventional reference points used on a mask.

Figure 10:
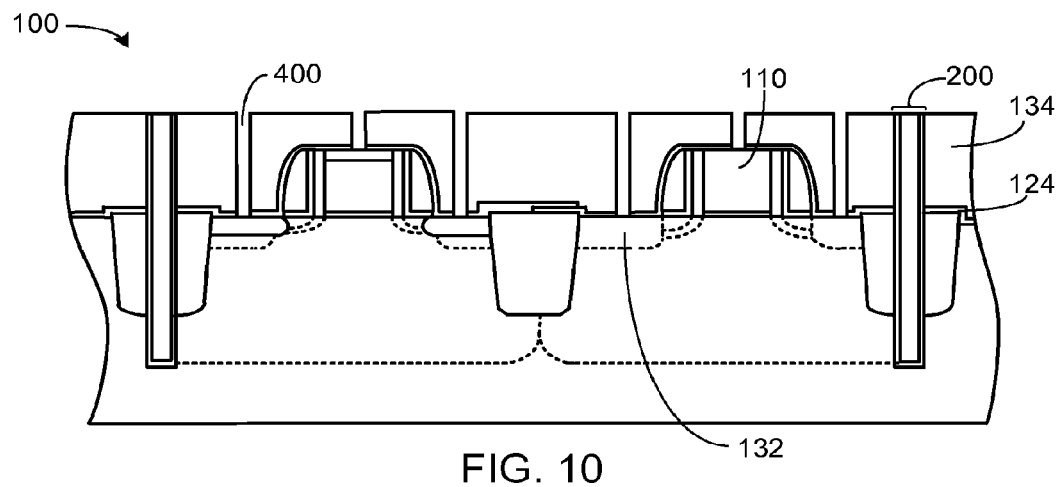
FIG. 10 is the structure of FIG. 9 after forming a contact opening.

Referring now to FIG. 10, therein is shown the structure of FIG. 9 after forming the contact opening 400. Generally, each of the contact opening 400 can be formed from the top side through the passivation layer 134 and the dielectric layer 124 to contact the gate 110 and the source/drain 132 of each active device by using the insulation layer 300, of FIG. 9, with the opening 900, of FIG. 9, as a mask. Notably, the insulation layer 300 and the location of each of the contact opening 400 prevents corrosion or contamination of the TSV 200, i.e., the contact opening 400 and the TSV 200 are physically and electrically separate from each other. The etchants and techniques used to form the contact opening 400 are well known within the art and not repeated herein.

It will be appreciated by those skilled in the art that after forming the contact opening 400, the insulation layer 300 can be removed by processes well known within the art and not described herein. Moreover, it will be appreciated by those skilled in the art that the present embodiments merely employ the insulation layer 300 as a mask, thereby permitting its removal and reducing the overall profile or thickness of the integrated circuit system 100.

Subsequent to forming the contact opening 400 and removing the insulation layer 300, it is to be understood that the integrated circuit system 100 may undergo a cleaning step to remove surface contaminants, such as particles, mobile ionic contaminants, organics and native oxides. In at least one embodiment, the cleaning step may include an SC-1 process.

Figure 11:
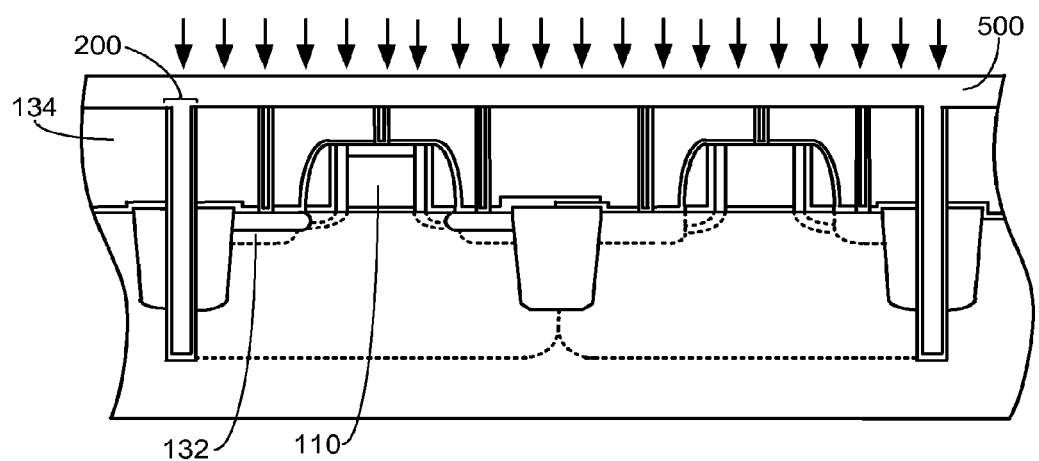
FIG. 11 is the structure of FIG. 10 after forming a conductive layer.

Referring now to FIG. 11, therein is shown the structure of FIG. 10 after forming the conductive layer 500. Generally, the conductive layer 500 may include any of the characteristics, such as material composition, thickness, function, and/or process techniques, described above in regard to FIG. 5. However, the present embodiment differs from the embodiment of FIG. 5 by forming the conductive layer 500 over or on the passivation layer 134 and in direct contact with the TSV 200. As with FIG. 5, the conductive layer 500 of the present embodiment can be deposited by any process that adequately fills each of the contact opening 400, of FIG. 10, thereby forming a solid and robust electrical interconnection (e.g., one without substantial voids) with each of the gate 110 and the source/drain 132.

Figure 12:
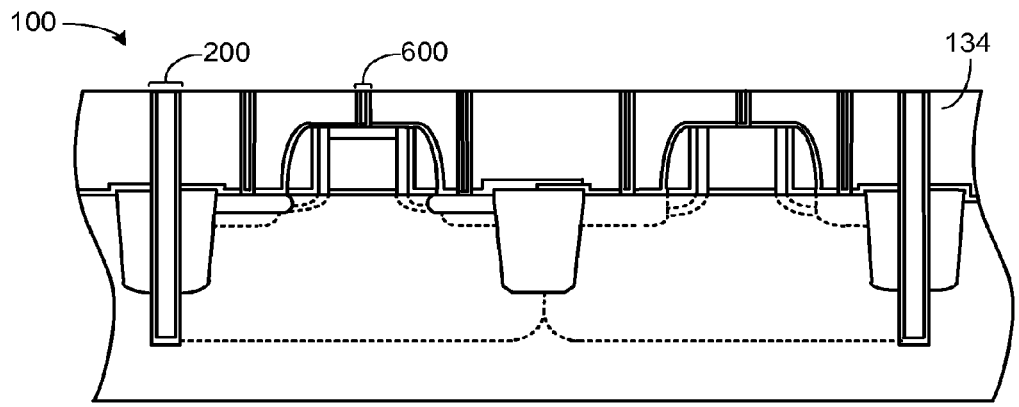
FIG. 12 is the structure of FIG. 11 after removal of excess material.

Referring now to FIG. 12, therein is shown the structure of FIG. 11 after removal of excess material. Generally, the integrated circuit system 100 may undergo a local or global planarization process that removes portions of the conductive layer 500 (of FIG. 11). In at least one embodiment, the conductive layer 500 can be removed until the passivation layer 134 is reached by a chemical mechanical planarization process, thereby exposing the TSV 200 and the contact 600. It is to be understood that the contact 600 is formed from the conductive layer 500 filled within the contact opening 400, of FIG. 10.

Notably, the TSV 200 and the contact 600 can be physically and electrically separated from each other by employing the method, system, and/or device described by the present embodiments herein.

Subsequent to planarization, it is to be understood that the integrated circuit system 100 may undergo a cleaning step to remove surface contaminants, such as particles, mobile ionic contaminants, organics and native oxides.

Thus, it has been discovered that the use of the insulation layer 300 (of FIG. 9), such as a nitride mask, to define the contact opening 400 after forming the TSV 200, helps to protect the TSV 200 from contamination and corrosion. For example, by forming the insulation layer 300 over the TSV 200, the insulation layer 300 helps to protect the TSV 200 from corroding during formation of the contact opening 400. Moreover, by separating the etching processes used to form the TSV 200 and the contact 600 by forming the insulation layer 300, incidences of cross contamination can be reduced. Furthermore, separating the etch processes by forming the insulation layer 300 permits the TSV 200 to be formed of a different material from the contact 600, thereby permitting separate optimization for each structure.

Figure 13:
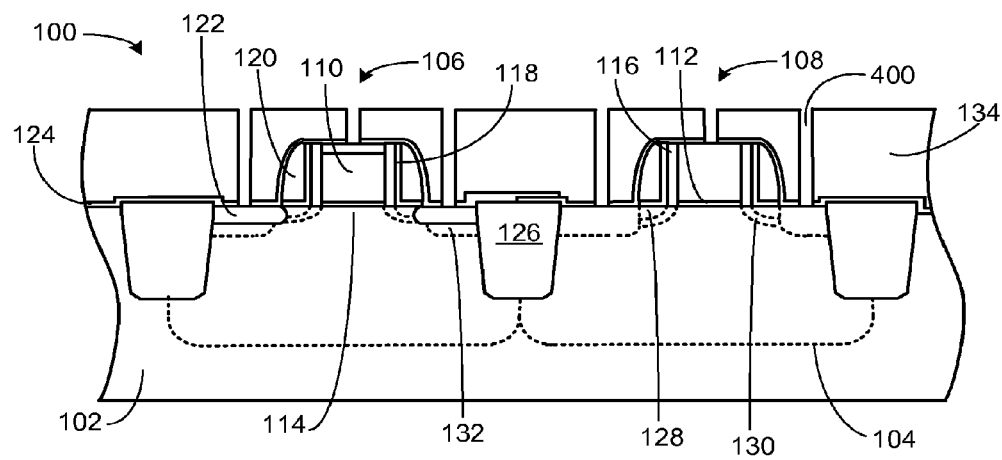
FIG. 13 is a partial cross sectional view of an integrated circuit system in an initial stage of manufacture in accordance with an embodiment of the present invention.

Referring now to FIG. 13, therein is shown a partial cross sectional view of the integrated circuit system 100 in an initial stage of manufacture in accordance with another embodiment of the present invention. The integrated circuit system 100 may include the substrate 102, the well 104, the first device 106, the second device 108, the gate 110, the gate dielectric 112, the channel 114, the first spacer 116, the first liner 118, the second spacer 120, the silicide contact 122, the dielectric layer 124, the isolation structure 126, the source/drain extension 128, the halo 130, the source/drain 132, and the passivation layer 134. It is to be understood that the substrate 102, the well 104, the first device 106, the second device 108, the gate 110, the gate dielectric 112, the channel 114, the first spacer 116, the first liner 118, the second spacer 120, the silicide contact 122, the dielectric layer 124, the isolation structure 126, the source/drain extension 128, the halo 130, the source/drain 132, and the passivation layer 134 may include any of the characteristics, such as material composition, thickness, function and/or process techniques, described above in regard to FIG. 1.

The integrated circuit system 100 of the present embodiment however differs from the integrated circuit system 100, of FIG. 1, by not forming the TSV opening 136, of FIG. 1, at this state of manufacture. The integrated circuit system 100 of the present embodiment instead forms the contact opening 400 within the passivation layer 134 at this stage of manufacture. It will be appreciated by those skilled in the art that a mask layer (not shown) can be formed over or on at least a part of the integrated circuit system 100 and patterned to form each of the contact opening 400 aligned with the gate 110 and the source/drain 132.

Subsequent to forming the contact opening 400, the mask can be removed and the integrated circuit system 100 may undergo a cleaning step to remove surface contaminants, such as particles, mobile ionic contaminants, organics and native oxides. In at least one embodiment, the cleaning step may include an SC-1 process.

Figure 14:
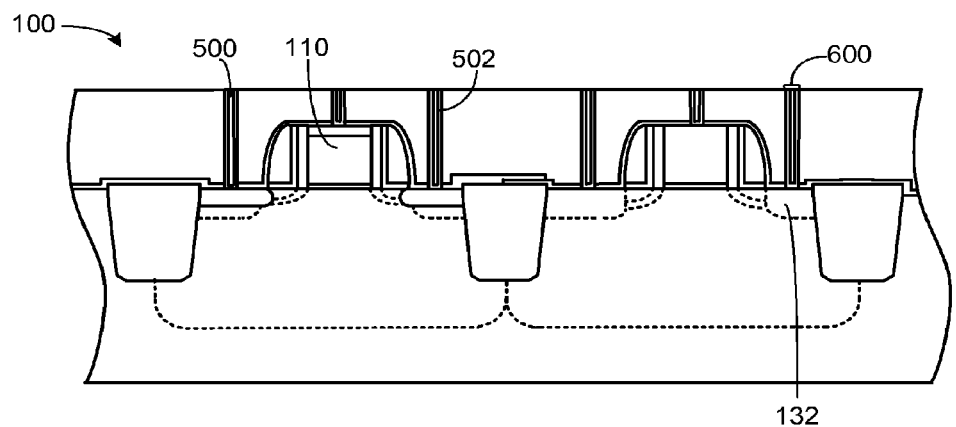
FIG. 14 is the structure of FIG. 13 after forming a contact.

Referring now to FIG. 14, therein is shown the structure of FIG. 13 after forming the contact 600. Generally, the contact 600 may include any material that offers a low resistance to the passage of electrical current. In at least one embodiment, the contact 600 may include a tungsten type material. In such cases, prior to forming the contact 600, the barrier layer 502, such as titanium/titanium nitride layer, can be deposited to improve adhesion and to reduce electromigration of the tungsten material, although it is understood that other barrier layers can be used, as well.

In at least one embodiment, it will be appreciated by those skilled in the art that an in-situ hydrogen-based plasma treatment can be utilized during the tungsten nucleation step, thereby helping to reduce and/or eliminate detrimental fluorine concentration at the tungsten/titanium nitride interface. Moreover, it will be appreciated by those skilled in the art that reduced fluorine concentration levels can help to increase the titanium/titanium nitride and tungsten process windows, thereby allowing thinner barrier or tungsten nucleation layers to be introduced for further contact resistance reduction without yield compromise.

Generally, the contact 600 can be deposited by any process that adequately fills each of the contact opening 400, of FIG. 13, thereby forming a solid and robust electrical interconnection (e.g., one without substantial voids) with each of the gate 110 and the source/drain 132. It is to be understood that each of the contact opening 400 can be overfilled to ensure adequate filling of the contact opening 400. By way of example, the contact 600 and the barrier layer 502 can be deposited by CVD, PVD or ALD type process.

Subsequent to forming the barrier layer 502 and the conductive layer 500 within the contact opening 400, the integrated circuit system 100 can be subject to an etching or planarization process to remove excess material of the barrier layer 502 and the conductive layer 500 to form the contact 600. Such a process was described above in reference to FIG. 6.

Figure 15:
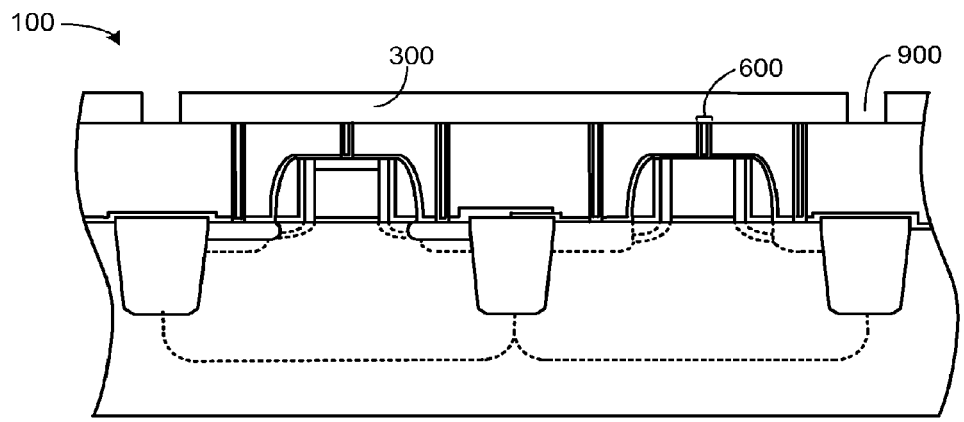
FIG. 15 is the structure of FIG. 14 after forming an insulation layer.

Referring now to FIG. 15, therein is shown the structure of FIG. 14 after forming the insulation layer 300. In at least one embodiment, the insulation layer 300 may include a nitride (e.g., a nitride mask), although it is understood that other dielectric materials may be used as well. Generally, the purpose or function of the insulation layer 300 can be to cover and protect the contact 600 from corrosion or contamination that may occur during subsequent through-silicon-via formations. Typically, the thickness of the insulation layer 300 can vary with the design specifications and/or the current technology process node (e.g., 45 nm, 32 nm, etc.) for the integrated circuit system 100; however, these parameters are not limiting. As such, in accordance with the present embodiments, the thickness of the insulation layer 300 is only to be limited to an amount that protects the contact 600 from subsequent process steps.

In at least one embodiment, the insulation layer 300 can be patterned to define a through-silicon-via. In such cases, the opening 900 can be formed in locations within the insulation layer 300 that define subsequent areas for forming through-silicon-vias.

Figure 16:
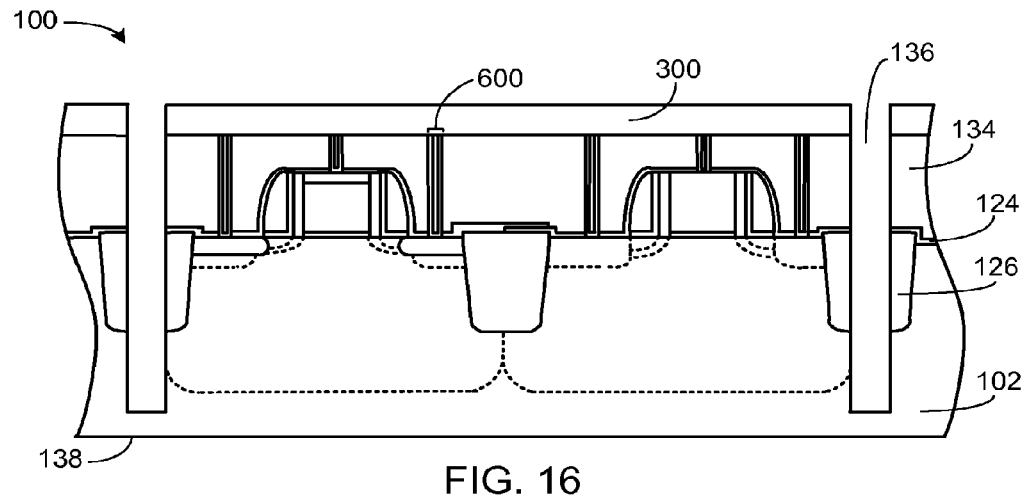
FIG. 16 is the structure of FIG. 15 after forming a TSV opening.

Referring now to FIG. 16, therein is shown the structure of FIG. 15 after forming the TSV opening 136. The TSV opening 136 can be formed from the top side through the passivation layer 134, the dielectric layer 124, the isolation structure 126, and into the substrate 102 in one or more regions of the integrated circuit system 100. In other embodiments, the TSV opening 136 can be formed all the way through the substrate 102. In yet other embodiments, the TSV opening 136 can be formed from the bottom side 138 of the substrate 102. It is to be understood that the TSV opening 136 may include a through-silicon-via that can be used for electrical interconnections. In at least one embodiment, each of the TSV opening 136 can be formed so as to not touch the contact 600.

Generally, the TSV opening 136 can be formed by machining and/or etching. In such cases, mechanical drilling, laser ablation, and certain wet and dry etches can be used, for example.

It will be appreciated by those skilled in the art that the depth and diameter of the TSV opening 136 can vary with the via type, the application, the design specifications and/or the current technology process node (e.g., 45 nm, 32 nm, etc.) for the integrated circuit system 100. By way of example, the depth of the TSV opening 136 can vary from about 20 microns to about 500 microns and the diameter can vary from about 200 nm to about 200 microns. Generally, the aspect ratio for the TSV opening 136 can vary from about 0.3:1 to greater than about 20:1.

Subsequent to forming the TSV opening 136, the insulation layer 300 can be removed and the integrated circuit system 100 may undergo a cleaning step to remove surface contaminants, such as particles, mobile ionic contaminants, organics and native oxides. In at least one embodiment, the cleaning step may include an SC-1 process.

It will be appreciated by those skilled in the art that the present embodiments merely employ the insulation layer 300 as a mask, thereby permitting its removal and reducing the overall profile or thickness of the integrated circuit system 100.

Figure 17:
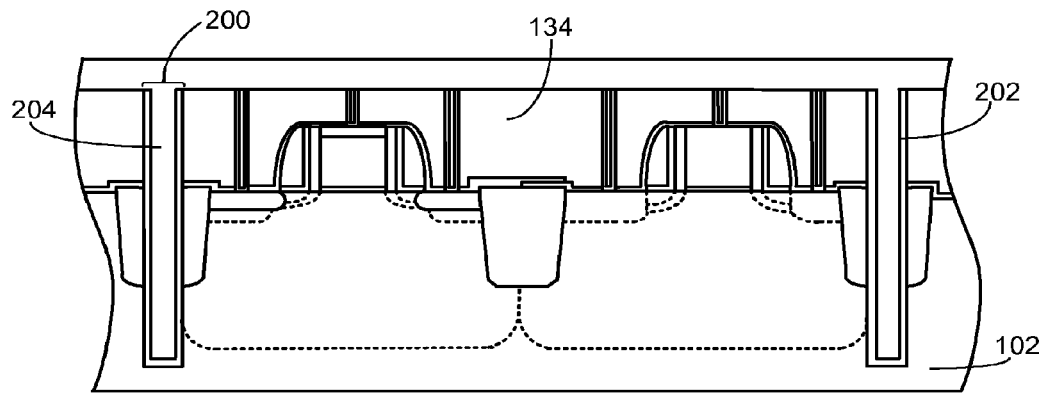
FIG. 17 is the structure of FIG. 16 after forming a TSV.

Referring now to FIG. 17, therein is shown the structure of FIG. 16 after forming the TSV 200. The TSV 200 may include the TSV barrier 202 and the TSV conductor 204.

Generally, the TSV barrier 202 may include a dielectric material that helps to electrically insulate or isolate the TSV conductor 204 from the substrate 102. In at least one embodiment, the TSV barrier 202 may include an oxide layer formed by thermal oxidation, although it is understood that other materials and processes can be used. It will be appreciated by those skilled in the art that the TSV barrier 202 can be strategically designed to also help reduce electromigration of mobile ionic contaminants. It is to be understood that the TSV barrier 202 can be formed within the TSV opening 136, of FIG. 16.

The TSV conductor 204 can be deposited after forming the TSV barrier 202 and may include any conductive material. In at least one embodiment, the TSV conductor 204 may include a tungsten or copper material. It will be appreciated by those skilled in the art that a seed layer can be deposited before filling with the TSV conductor 204 to improve the deposition and interface quality.

Generally, the TSV conductor 204 can be deposited by any process that adequately fills each of the TSV opening 136, thereby forming a solid and robust electrical interconnection (e.g., one without substantial voids). It is to be understood that each of the TSV opening 136 can be overfilled to ensure adequate filling of the TSV opening 136. In such cases, the TSV conductor 204 can be formed over or on the passivation layer 134 with an adequate thickness. By way of example, the TSV conductor 204 can be deposited by a CVD, a PVD or an ALD type process.

Figure 18:
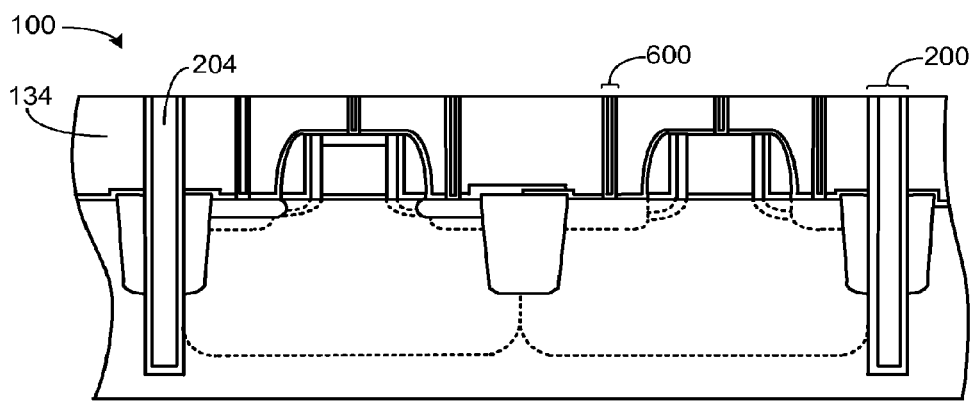
FIG. 18 is the structure of FIG. 17 after removal of excess material.

Referring now to FIG. 18, therein is shown the structure of FIG. 17 after removal of excess material. Generally, the integrated circuit system 100 may undergo a local or global planarization process. In at least one embodiment, the excess portions of the TSV conductor 204 formed above the passivation layer 134 can be removed until the passivation layer 134 is reached by a chemical mechanical planarization process, thereby exposing the TSV 200 and the contact 600.

Notably, the TSV 200 and the contact 600 can be physically and electrically separated from each other by employing the method, system, and/or device described by the present embodiments herein.

Subsequent to planarization, it is to be understood that the integrated circuit system 100 may undergo a cleaning step to remove surface contaminants, such as particles, mobile ionic contaminants, organics and native oxides.

Thus, it has been discovered that the use of the insulation layer 300 (of FIG. 16), such as a nitride mask, to define the TSV opening 136, of FIG. 16, after forming the contact 600, helps to protect the contact 600 from contamination and corrosion. For example, by forming the insulation layer 300 over the contact 600, the insulation layer 300 helps to protect the contact 600 from corroding during formation of the TSV opening 136. Moreover, by separating the etching processes used to form the TSV 200 and the contact 600 by forming the insulation layer 300, incidences of cross contamination can be reduced. Furthermore, separating the etch processes by forming the insulation layer 300 permits the TSV 200 to be formed of a different material from the contact 600, thereby permitting separate optimization for each structure.

It will be appreciated by those skilled in the art that the through-silicon-vias depicted in the embodiments of FIGS. 1-18 can be between two or more substrates/wafers bonded to each other in a three-dimensional stacked structure. Moreover, after being formed, any three-dimensional stacked structure (e.g., stacked wafers) can be diced into individual stacked dies or chips, each stacked die or chip potentially possessing multiple layers of integrated circuitry.

Figure 19:
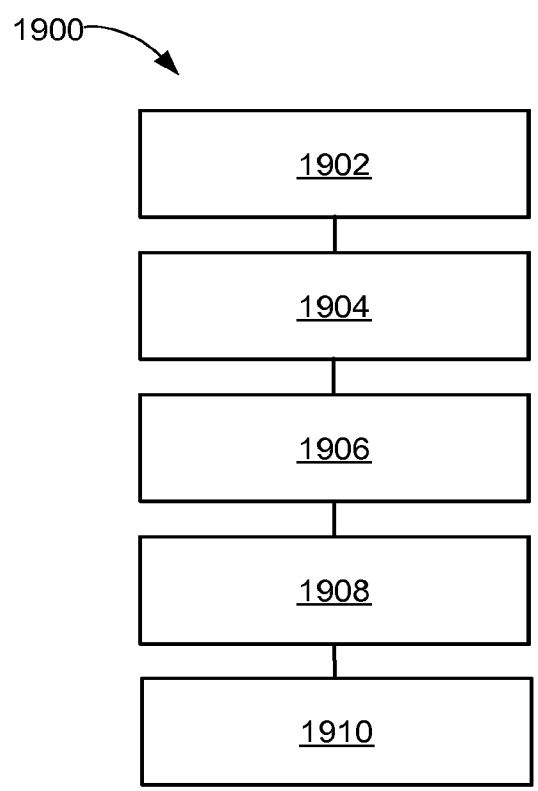
FIG. 19 is a flow chart of a method of manufacture of an integrated circuit system in an embodiment of the present invention.

Referring now to FIG. 19, therein is shown a flow chart of a method 1900 of manufacture of the integrated circuit system 100 in an embodiment of the present invention. The method 1900 includes: providing a substrate including an active device in a block 1902; forming a through-silicon-via into the substrate in a block 1904; forming an insulation layer over the through-silicon-via to protect the through-silicon-via in a block 1906; forming a contact to the active device after forming the insulation layer in a block 1908; and removing the insulation layer in a block 1910.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

It has been discovered that the present invention thus has numerous aspects. One such aspect is that the present invention helps to protect a TSV from corroding during contact etching. Another aspect is that the present invention helps to protect a contact from corroding during TSV etching.

It has been discovered that the present invention helps to separate the etching process for each of the TSV and the contact by forming an insulation layer, thereby eliminating cross contamination issues.

It has been discovered that the present invention provides a method for an independent TSV plug, e.g., by separating the formation of the TSV and the contact by forming an insulation layer. By allowing the TSV and the contact to be formed of separate materials, each structure can be separately optimized.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:
1. An integrated circuit (IC) device comprising:
   a substrate including an active component;
   a passivation layer being disposed over the substrate and the active component;
   a through-silicon-via (TSV) contact for facilitating stacking of IC devices, wherein the TSV contact comprises a top surface and a continuous depth which extends from a top side of the IC device through the passivation layer and into the substrate; and a device contact which comprises a top surface and a depth to the active device, wherein the top surfaces of the TSV and device contacts are exposed.

2. The device of claim 1 wherein the TSV contact passes through an isolation structure in the substrate.

3. The device of claim 1 wherein the TSV contact and the device contact comprise different material.

4. The device of claim 1 wherein the top surfaces of the TSV and device contacts are coplanar with each other.

5. The device of claim 1 wherein the device contact passes through the passivation layer.

6. The device of claim 1 wherein the TSV contact and the contact are physically separated from each other.

7. The device of claim 2
wherein the substrate has a thickness $T_s$, the substrate includes a TSV region in the substrate, the TSV region has a first material different from the substrate, the TSV region has a TSV depth $D_{TSV}$ which is less than $T_s$; and
comprises a via in the substrate through the TSV region, wherein the via has a via depth $D_v$ which is greater than $D_{TSV}$ and less than $T_s$ and the TSV contact is in the via.

8. The device of claim 2 comprising a trench in the substrate filled with a first material different from the substrate, and wherein the TSV contact is disposed in the substrate through the trench.

* * * * *